(12) United States Patent
Tai et al.

(10) Patent No.: US 11,119,697 B2
(45) Date of Patent: Sep. 14, 2021

(54) READ VOLTAGE MANAGEMENT BASED ON WRITE-TO-READ TIME DIFFERENCE

(71) Applicant: MICRON TECHNOLOGY, INC., Boise, ID (US)

(72) Inventors: Ying Yu Tai, Mountain View, CA (US); Jiangli Zhu, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 39 days.

(21) Appl. No.: 16/510,567

(22) Filed: Jul. 12, 2019

(65) Prior Publication Data
US 2021/0011658 A1    Jan. 14, 2021

(51) Int. Cl.
*G06F 12/00* (2006.01)
*G06F 3/06* (2006.01)
*G11C 7/10* (2006.01)
*G11C 7/22* (2006.01)

(52) U.S. Cl.
CPC .......... *G06F 3/0659* (2013.01); *G06F 3/0604* (2013.01); *G06F 3/0673* (2013.01); *G11C 7/1051* (2013.01); *G11C 7/1096* (2013.01); *G11C 7/222* (2013.01)

(58) Field of Classification Search
CPC .... G06F 3/0659; G06F 3/0604; G06F 3/0673; G06F 12/246; G06F 2212/72; G11C 7/1051; G11C 7/1096; G11C 7/222
See application file for complete search history.

(56) References Cited

U.S. PATENT DOCUMENTS

| | | | |
|---|---|---|---|
| 8,908,460 B2 | 12/2014 | Mun et al. | |
| 2008/0123420 A1 | 11/2008 | Brandman et al. | |
| 2012/0120732 A1* | 5/2012 | Lee | G11C 11/5628 365/185.22 |
| 2013/0290811 A1 | 10/2013 | Liikanen et al. | |
| 2016/0004437 A1 | 1/2016 | Kim et al. | |
| 2017/0287564 A1 | 10/2017 | Park et al. | |
| 2019/0146689 A1* | 5/2019 | Zhou | G11C 16/3418 711/103 |

OTHER PUBLICATIONS

International Search Report and Written Opinion for International Application No. PCT/2020/041708, dated Oct. 26, 2020, 11 pages.

\* cited by examiner

*Primary Examiner* — Shawn X Gu
(74) *Attorney, Agent, or Firm* — Lowenstein Sandler LLP

(57) ABSTRACT

A request can be received to perform a read operation to retrieve data at a memory sub-system. A time to perform the read operation can be determined. A time a write operation was performed to store the data at the memory sub-system can be determined. An amount of time that has elapsed since the time the performance of the write operation until the time to perform the read operation can be determined. A read voltage from a plurality of read voltages can be selected based on the amount of time that has elapsed. The read operation can be performed to retrieve the data by using the read voltage.

20 Claims, 5 Drawing Sheets

READ VOLTAGE MANAGEMENT BASED ON WRITE-TO-READ TIME DIFFERENCE

TECHNICAL FIELD

Embodiments of the disclosure relate generally to memory sub-systems, and more specifically, relate to read voltage management based on a write to read time difference at a memory sub-system.

BACKGROUND

A memory sub-system can be a storage device, a memory module, and a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
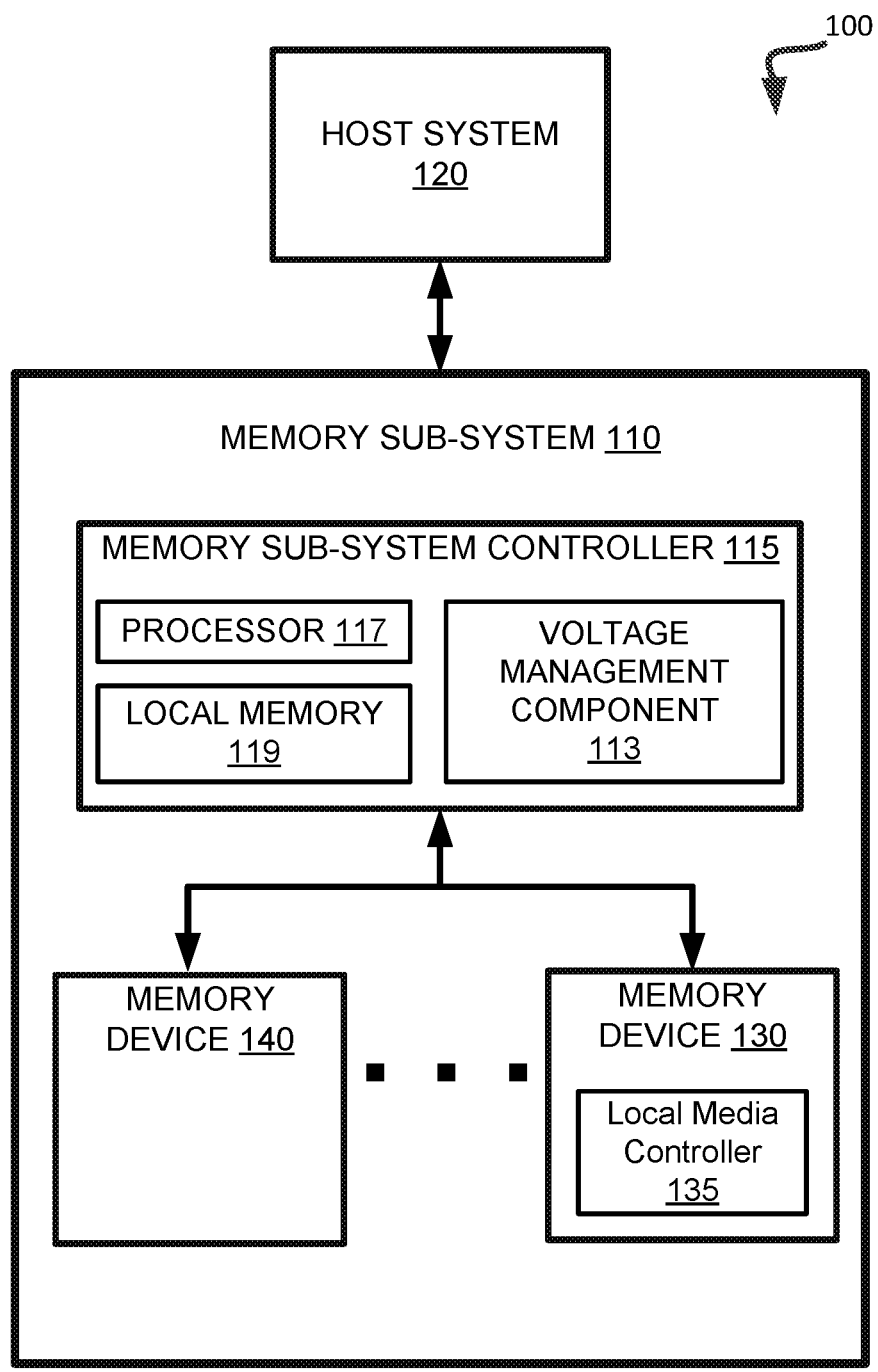
FIG. 1 illustrates an example computing environment that includes a memory sub-system in accordance with some embodiments of the present disclosure.

Aspects of the present disclosure are directed to read voltage management based on a write to read time difference at a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

A conventional memory sub-system can perform a read operation to retrieve data stored at memory components of the memory sub-system. For example, to perform the read operation, an initial read voltage of a sequence of read voltages can be applied to memory cells that store data subject to the read operation to determine whether the memory cell is in a high voltage state, representing a bit value of '1', a low voltage state, representing a bit value of '0', or vice versa. The sequence of read voltages can include an ordering of read voltages to be applied to memory cells when a read operation is performed to retrieve data stored at the memory cells. Under certain circumstances, the performance of the read operation at the initial read voltage can fail and the data stored at a memory component cannot be retrieved. In order to retrieve the requested data, an error correction operation can be performed at the memory cells that store the data. Responsive to the error correction operation failing to successfully retrieve the requested data, the read operation can be retried using a different read voltage of the sequence of read voltages. Error correction operations and read operations using different read voltages can be continuously performed at the memory cells that store the data until the requested data is successfully retrieved. After the data is successfully retrieved, a subsequent read operation request can be received to read the same data. With conventional systems, the subsequent read operation is typically performed using the initial read voltage of the sequence of read voltages, even though performing the read operation using the initial read voltage was unsuccessful to retrieve the data responsive to the prior read operation request.

For some types of memory devices, as the amount of time that has elapsed since the data was written to the memory sub-system continuously increases, the likelihood that a particular read voltage will fail also increases. For example, as the amount of time that has elapsed increases, the initial read voltage is more likely to fail. As a result, the number of error correction operations and read operations using different read voltages to successfully retrieve the data increases for each read operation request. Subsequent read operations at the same memory cells will have a higher bit error rate, which can decrease the performance of a memory sub-system as a result of more frequent error recovery operations being performed. Bit error rate (BER) is the number of corrupted bits relative to the number of total bits read. Additionally, the likelihood of unrecoverable data loss for the memory cells can increase.

Aspects of the present disclosure address the above and other deficiencies by determining an initial read voltage based on a write to read time difference for data subject to a read operation request. A write-to-read time difference is the period of time that passes between when data is written to a memory component and when the data is read from the memory component. For example, when data is written to the memory sub-system, a timestamp, or other indication, of when the data was written can be recorded. Subsequently, a request to perform a read operation to retrieve the data can be received and a timestamp, or other indication, of when the read operation is to be performed can be determined. Based on an amount of time that has elapsed since the performance of the write operation to store the data until the time to perform the read operation to retrieve the data, an initial read voltage, of a sequence of read voltages, can be determined. The read operation can be performed using the initial read voltage. Responsive to the read operation at the initial read voltage failing to retrieve the data, a subsequent read voltage of the sequence of read voltages can applied to the memory cells to retry the read operation. After the data is successfully retrieved, a subsequent read operation request can be received to read the same data. The subsequent read operation can be performed using the subsequent read voltage of the sequence of read voltages that was used in successfully retrieving the data as the initial read voltage.

Advantages of the present disclosure include, but are not limited to, a decrease in the error rate of a read operation at the memory sub-system. For example, an initial read voltage can be determined, from a sequence of read voltages, which is likely to successfully retrieve data based on an amount of time that has elapsed since the performance of the write operation until the time to perform the read operation. Additionally, the performance of the memory sub-system can be improved as fewer error correction operations can be performed. This is a result of the data stored at the memory sub-system being less likely to be read with errors due to the initial read voltage used for performing a read operation. Similarly, since fewer read retry operations or other error correction operations are performed, an increased number of read operations and write operations can be performed by the memory sub-system.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

In one embodiment, each of the memory devices 130 can include one or more arrays of memory cells such as single level cells (SLCs), multi-level cells (MLCs), triple level cells (TLCs), or quad-level cells (QLCs), or a combination of such. In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

The memory sub-system 110 includes a voltage management component 113 that can be used to manage voltages that are used for read operations to retrieve data stored at the memory sub-system 110. In some embodiments, the memory sub-system controller 115 includes at least a portion of the voltage management component 113. For example, the memory sub-system controller 115 can include a processor 117 (processing device) configured to execute instructions stored in local memory 119 for performing the operations described herein. In some embodiments, the voltage management component 113 is part of the host system 120, an application, or an operating system.

The voltage management component 113 can be used to manage the voltage for read operations on the memory sub-system. The voltage management component 113 can receive an indication that a read operation is to be performed to retrieve data at the memory sub-system. The voltage management component 113 can determine, based on an amount of time that has elapsed since the time of performance of a write operation to store the data until a time to perform the read operation, a read voltage, from a set of read voltages. The read voltage can be used in performing the read operation to retrieve the data in accordance with the read operation request. Further details with regards to the operations of the voltage management component 113 are described below.

Figure 2:
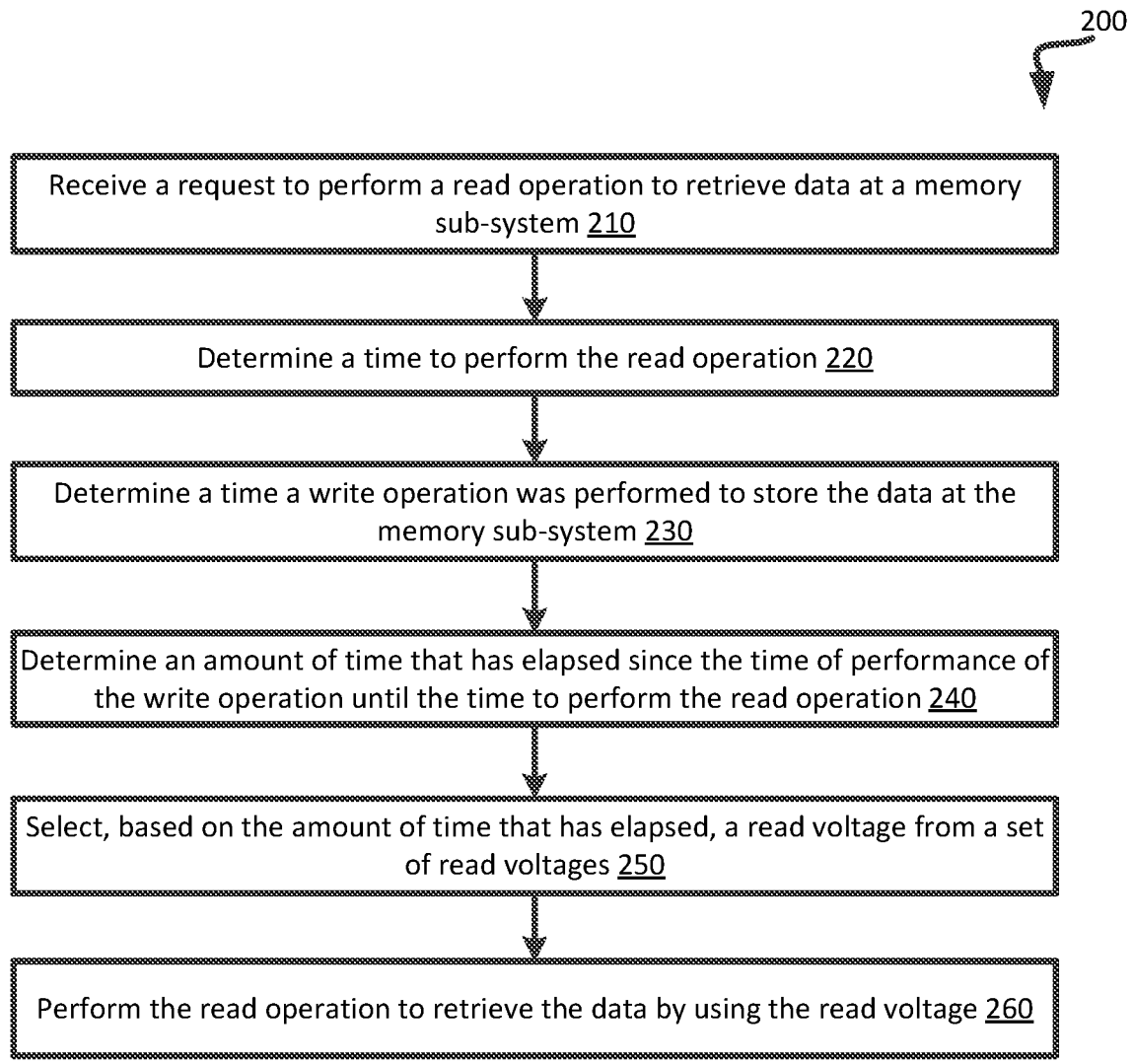
FIG. 2 is a flow diagram of an example method to manage read voltages based on a write to read time difference, in accordance with some embodiments of the present disclosure.

FIG. 2 is a flow diagram of an example method 200 to manage read voltages based on a write to read time difference in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the voltage management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, a processing device receives a request to perform a read operation to retrieve data at a memory sub-system. In some embodiments, the request can be added to a read queue that is maintained by a controller of the memory sub-system (i.e., controller 115 of FIG. 1). The read queue can include one or more additional requests to perform read operations to retrieve data at the memory sub-system.

At operation 220, the processing device determines a time to perform the read operation. In some embodiments, the time to perform the read operation can be the time the request to perform the read operation was received. The time the request was received can be determined from the controller of the memory sub-system. The controller can determine the time the request is received by referencing a timer maintained by the controller. Responsive to receiving the request to perform the read operation, the controller can generate a timestamp that indicates the time of the timer. The timestamp can indicate the time the request to perform the read operation was received.

In other embodiments, the time to perform the read operation can be determined based on the time the request to perform the read operation was received. For example, the controller can track an average read operation time lapse for read operations performed at the memory sub-system. The average read operation time lapse can indicate an average difference in time between when a request to perform a read operation is received and when the read operation is actually performed for a set of read operations. The average read operation time lapse can be added to the time the request to perform the read operation was received, thus providing an estimate of a time the read operation will be performed. In another example, the controller can determine an average amount of time that a read operation request is in the read queue before the read operation is performed. The average queue time can be added to the time the request to perform the read operation was received, thus providing an estimate of the time the read operation will be performed.

At operation 230, the processing device determines a time a write operation was performed to store the data at the memory sub-system. In some embodiments, a write operation to store data at one or more memory components of the memory sub-system is performed responsive to receiving a request to perform the write operation. The time the write operation was performed can be determined by the controller. The controller can determine the time the write operation was performed by referencing the timer at the time the write operation is performed and generating a timestamp that indicates the time the write operation was performed.

In some embodiments, the timestamp can be stored as metadata with the data stored at one or more memory components of the memory sub-system. Additionally, the timestamp can be stored at a memory component, of the memory sub-system, separate from the one or more memory components where the data is stored. For example, the timestamp can be stored in a buffer or a volatile memory of the controller that is included in the memory sub-system. The separate memory component can store one or more timestamps indicating a time a write operation was performed for data at the memory sub-system. In some embodiments, each timestamp stored at the separate memory component can indicate the time data included in a data group was stored at the memory sub-system. The data group can include one or more data that were written to the memory sub-system at separate times. In some embodiments, the data group can be a group of data units that store data at the memory sub-system. For example, data A, written to the memory sub-system at T1, and data B, written to the memory sub-system at T2, can be included in a data group. A data group timestamp can represent the time each data of the data group was written to the memory sub-system. As data is written to the memory sub-system and added to the data group, the data group timestamp can be updated to reflect the time the most recently written data of the data group was written to the memory sub-system. In accordance with the previous example, the data group timestamp for the data group including data A and data B can indicate T2 as the time data A and data B were written to the memory sub-system, as data B was written to the memory sub-system at a later point in time than data A.

Responsive to receiving the first indication of the time to perform the read operation, the data group that includes the data subject to the read operation request can be identified at the separate memory component of the memory sub-system. The data group timestamp can be determined for the identified data group. The data group timestamp can indicate the time that the data subject to the read operation request was written to the memory sub-system.

At operation 240, the processing device determines the amount of time that has elapsed since the time of performance of the write operation until the time to perform the read operation. The amount of time that has elapsed can be determined based on the time to perform the read operation, from the first indication, and the time the write operation was performed, from second indication. In some embodiments, the time to perform the read operation can be subtracted from the time the write operation was performed, resulting in the amount of time that has elapsed since the performance of the write operation to the time to perform the read operation.

At operation 250, the processing device selects a read voltage from a set of read voltages based on the amount of time that has elapsed. The processing device can determine one or more read voltages from the set of read voltages corresponding to the amount of time that has elapsed. Further details with regards to determining a read voltage from the set of read voltages are discussed with respect to FIG. 3.

At operation 260, the processing device performs the read operation to retrieve the data by using the selected read voltage. In some embodiments, the read operation can fail to successfully retrieve the data using the selected read voltage. An error correction operation can be performed to remedy the failed read operation that was performed using the selected read voltage. An error correction operation can include at least one of a hard decoding operation (i.e., decoding user data by receiving a binary channel output for each bit in a code word), a one-bit soft decoding operation (i.e., identifying one or more low confidence and high confidence bits and estimating the data based on the identified bits), a multi-bit soft decoding operation, or a redundant array of independent NAND (RAIN) operations (i.e., a data protection scheme for generating and writing exclusive- or (XOR) data to media). In some embodiments, the error correction operation can fail to remedy the failed read operation using the selected read voltage. In such embodiments, the processing logic can select a different read voltage from the set of read voltages to use to retry the read operation. In some embodiments, the different read voltage can be higher or lower than the read voltage determined at operation 250. For example, if a read voltage of 3.0 mV is initially used in performing the read operation, and the read operation fails to successfully retrieve the data, a different read voltage of 3.5 mV can be used in retrying the read operation. In some embodiments, the different read voltage can be selected from a set of available read voltages. Responsive to selecting the different read voltage from the set of read voltages, the processing device can retry the read operation, using the different read voltage, to retrieve the data. If the read operation is not successfully performed using the different read voltage, another different read voltage can be determined, in accordance with previously described embodiments, and used in re-trying the read operation to retrieve the data. For example, the read voltage can be incremented (or decremented) again and used to re-try the read operation to retrieve the data.

An initial read voltage from a set of read voltages can be selected based on the amount of time that has elapsed since a write operation was performed to store data until a read operation is to be performed to read the same data. If a read operation using the initial read voltage fails, then another read voltage can be selected to be used for the read operation. The other read voltage can be incremented or decremented from the initial read voltage. Subsequent read voltages can be incremented or decremented from a prior read voltage until a read operation is successful.

In some embodiments, the error correction operation is not performed prior to determining a different read voltage from the set of read voltages. The different read voltage can be determined and the processing device can re-try the read operation using the different read voltage. In some embodiments, each of the set of read voltages can be used to perform the read operation until a read voltage is used to successfully retrieve the data. If no read voltage of the set of read voltages successfully retrieve the data, the error correction operation can be performed to retrieve the data.

Figure 3:
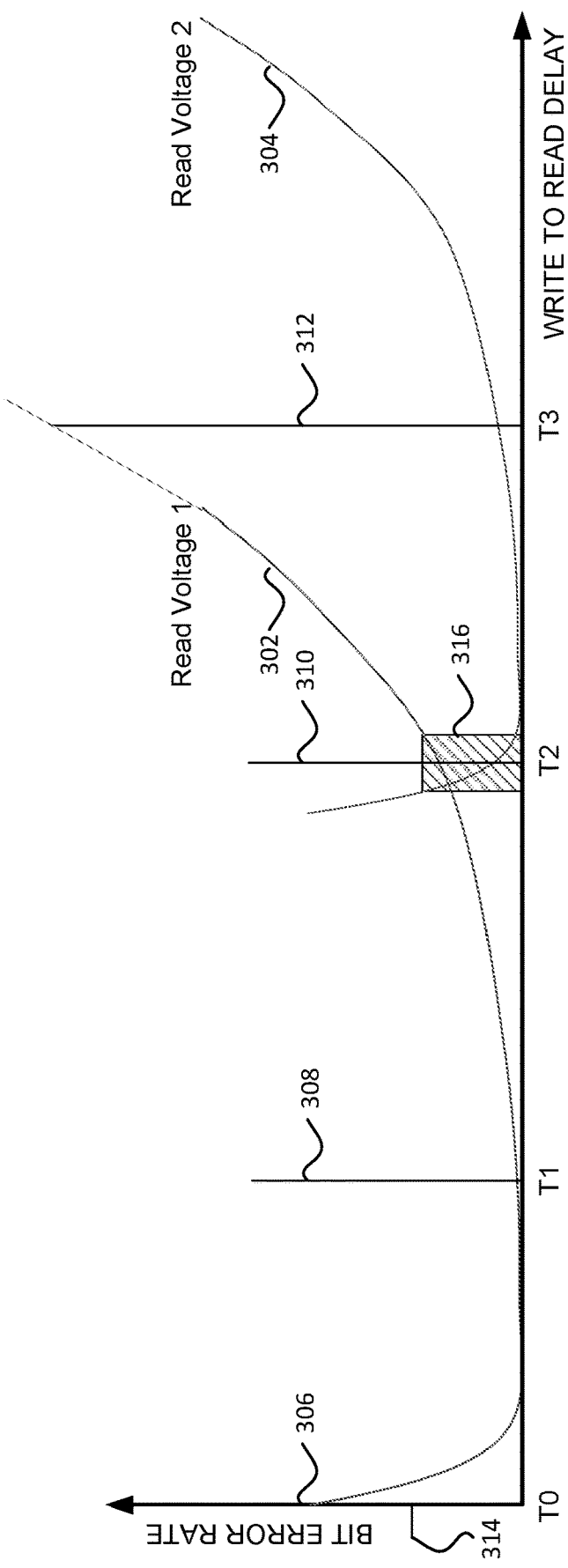
FIG. 3 illustrates bit error rates relative to write to read time differences, in accordance with some embodiments of the present disclosure.

FIG. 3 illustrates bit error rates relative to write to read time differences, in accordance with some embodiments of the present disclosure. In some embodiments, the voltage management component 113 of FIG. 1 can manage read voltages based on the write to read time difference.

Bit error rate (BER) is the number of corrupted bits relative to the number of total bits read. Curves 302 and 304 illustrate changes in the bit error rate for various read voltage levels (read voltages), such as read voltage 1 and read voltage 2, over the amount of time that has elapsed since data was written to the memory sub-system. For example, the bit error rate for read voltage 1 (illustrated by curve 302) is high at time T0 (306) (i.e., when the data is initially written to the memory sub-system) and the bit error rate decreases as the time since the data was written to the memory sub-system elapses to time T1 (308). As the time since the data was written to the memory sub-system elapses to time T2 (310), the bit error rate for read voltage 1 increases, as more time has elapsed since data has been written to the memory sub-system. In another example, the bit error rate for read voltage 2 (illustrated by curve 304) may be high at time T2 (310) and may decrease as the time since the data was written to the memory sub-system elapses to time T3 (312).

The memory sub-system can use a threshold bit error rate (314) to determine which read voltage from a set of read voltages (e.g., read voltage 1, read voltage 2) to use for a read operation. The threshold bit error rate 314 can indicate a bit error rate where it is determined that there is a very low probability that performing a read operation will fail. The threshold bit error rate 314 can be configurable and/or system defined. One or more read voltages can correspond to the write to read time difference. A read voltage can correspond to a write to read time difference if a bit error rate of the read voltage falls below a threshold bit error rate 314. In some embodiments, a read voltage can correspond to a write to read time difference if the read voltage is the only read voltage of the set of read voltages that can be used to retrieve the data, even though the bit error rate exceeds the threshold bit error rate 314.

In one embodiment, one read voltage can be associated with the write-to-read time difference. For example, the data can be written at an initial time T0 (306), and the request to perform the read operation can be received at time T1 (308). Read voltage 1 can correspond to time T1, as read voltage 1 at T1 falls below the threshold bit error rate 314. As such, the read operation can be performed to retrieve the data using read voltage 1. In another example, the request to perform the read operation can be received at time T3 (312). Read voltage 2 can correspond to T3, as read voltage 2 at T3 falls below the threshold bit error rate 314. Read voltage 1 does not correspond to T3, as read voltage 2 at T3 exceeds the threshold bit error rate 314, and at least one other read voltage of the plurality of read voltages corresponds to T3. As such, the read operation can be performed to retrieve the data using read voltage 2.

In another embodiment, more than one read voltage can correspond to the write to read time difference. For example, the request to perform the read operation can be received at time T2 (310). As illustrated by FIG. 3, point 310 falls within an overlap range 316. Overlap range 316 indicates that read voltage 1 and read voltage 2 can correspond with T2, as read voltage 1 and read voltage 2 both fall below the threshold bit error rate 314. In some embodiments, the processing logic can determine to perform the read operation using the lowest read voltage level (e.g., read voltage 1). If the read operation does not successfully retrieve the data using the lowest read voltage level (e.g., read voltage 1), a higher read voltage level (e.g., read voltage 2) can be used to re-try the read operation. In other embodiments, the processing logic can determine which of the set of read voltage levels (e.g., read voltage 1 or read voltage 2) to use to perform the read operation based on an operating characteristic of the memory sub-system such as a cross temperature associated with the memory sub-system, an operating temperature of the memory sub-system, a wear level of the memory sub-system, or a cycle count associated with the memory sub-system, or multiples or a combination of such. For example, the read voltage that is to be used as the initial read voltage from the set of read voltages for a particular write-to-read time difference can be based on the operating characteristic of the memory sub-system. Thus, at a particular write to read time difference, the read voltage 1 can be selected as the initial read voltage and as the operating temperature of the memory sub-system changes or the wear level of the memory sub-system increases, the read voltage 2 can be selected as the initial read voltage for the particular write to read time difference for subsequent read requests.

Figure 4:
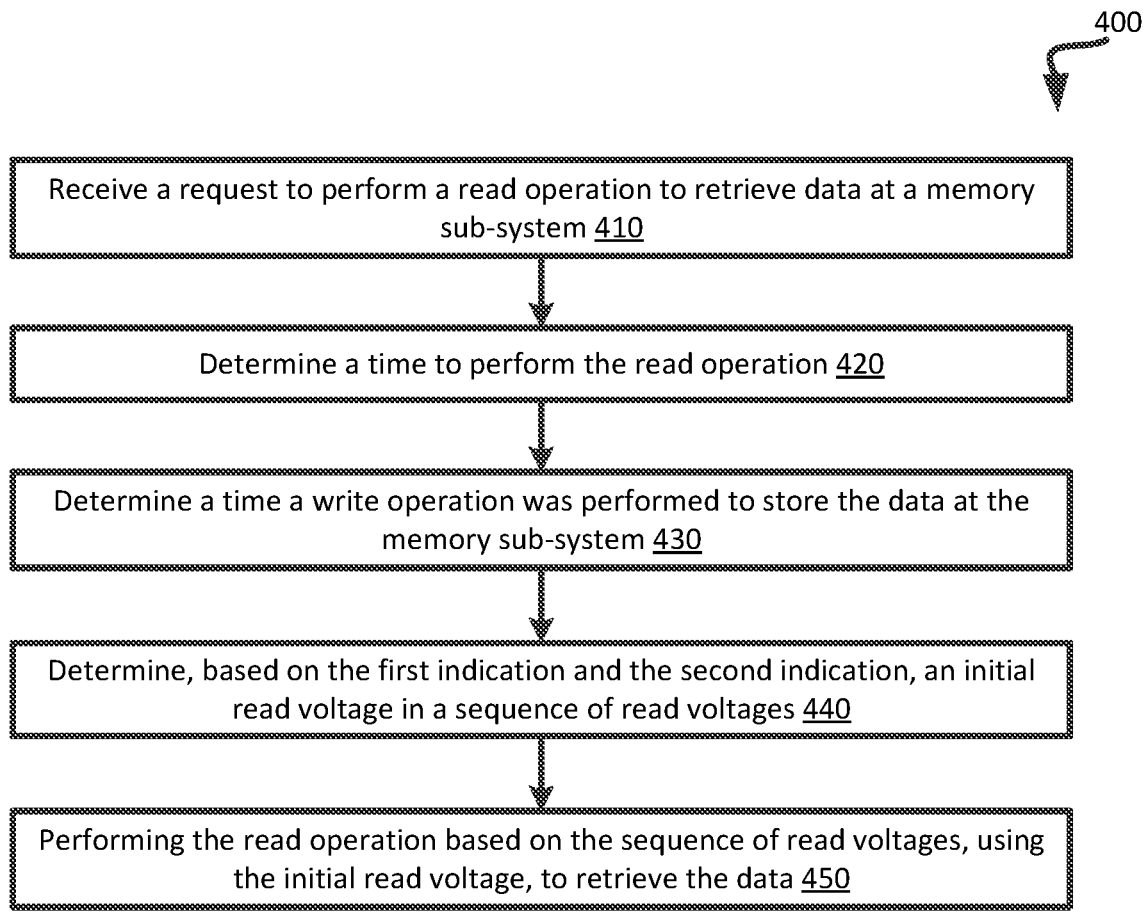
FIG. 4 is a flow diagram of another example method to manage read voltages based on a write to read time difference, in accordance with some embodiments.

FIG. 4 is a flow diagram of another example method 400 to manage read voltages based on a write to read time difference, in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the voltage management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 4, at operation 410, a processing device receives a request to perform a read operation to retrieve data at a memory sub-system. In some embodiments, the request can be added to a read operation queue maintained by a controller of the memory sub-system (i.e., controller 115 of FIG. 1), in accordance with previously described embodiments.

At operation 420, the processing device determines a time to perform the read operation. In some embodiments, the time to perform the read operation can be the time the request to perform the read operation was received. In other embodiments, the time to perform the read operation can be determined based on the time the request to perform the read operation was received.

At operation 430, the processing device determines a time a write operation was performed to store the data at the memory sub-system. A timestamp indicating the time the write operation was performed to store the data can be stored at a memory component, of the memory sub-system, separate from the one or more memory components where the data is stored.

At operation 440, the processing device determines an initial read voltage in a sequence of read voltages based on the first indication and the second indication. The sequence of read voltages can include an ordering of one or more read voltages that can be used in performing a read operation. The initial read voltage can be the first read voltage from the sequence that is used to perform a read operation. In some embodiments, an amount of time that has elapsed since the time of performance of the write operation until the time to perform the read operation can be determined based on the first indication and the second indication. The amount of time that has elapsed can be determined by subtracting the time to perform the read operation, from the first indication, from the time the write operation was performed to store the data, from the second indication. Responsive to determining the amount of time that has elapsed, one or more read voltages corresponding the amount of time that has elapsed can be determined. Further details regarding determining a read voltage from the set of read voltages are discussed with respect to FIG. 3.

At operation 450, the processing device performs the read operation based on the sequence of read voltages, beginning at the initial read voltage, to retrieve the data. In some embodiments the read operation can fail to successfully retrieve data from the memory sub-system using the initial read voltage. An error correction operation can be performed to remedy the failed read operation that was performed using the initial read voltage. In some embodiments, the error correction operation can fail to remedy the failed read operation that was performed using the initial read voltage.

In such embodiments, the processing logic can determine a subsequent read voltage from the sequence of read voltages to use to re-try the read operation. Responsive to determining the subsequent read voltage from the sequence of read voltages, the processing logic can re-try the read operation, using the subsequent read voltage.

Figure 5:
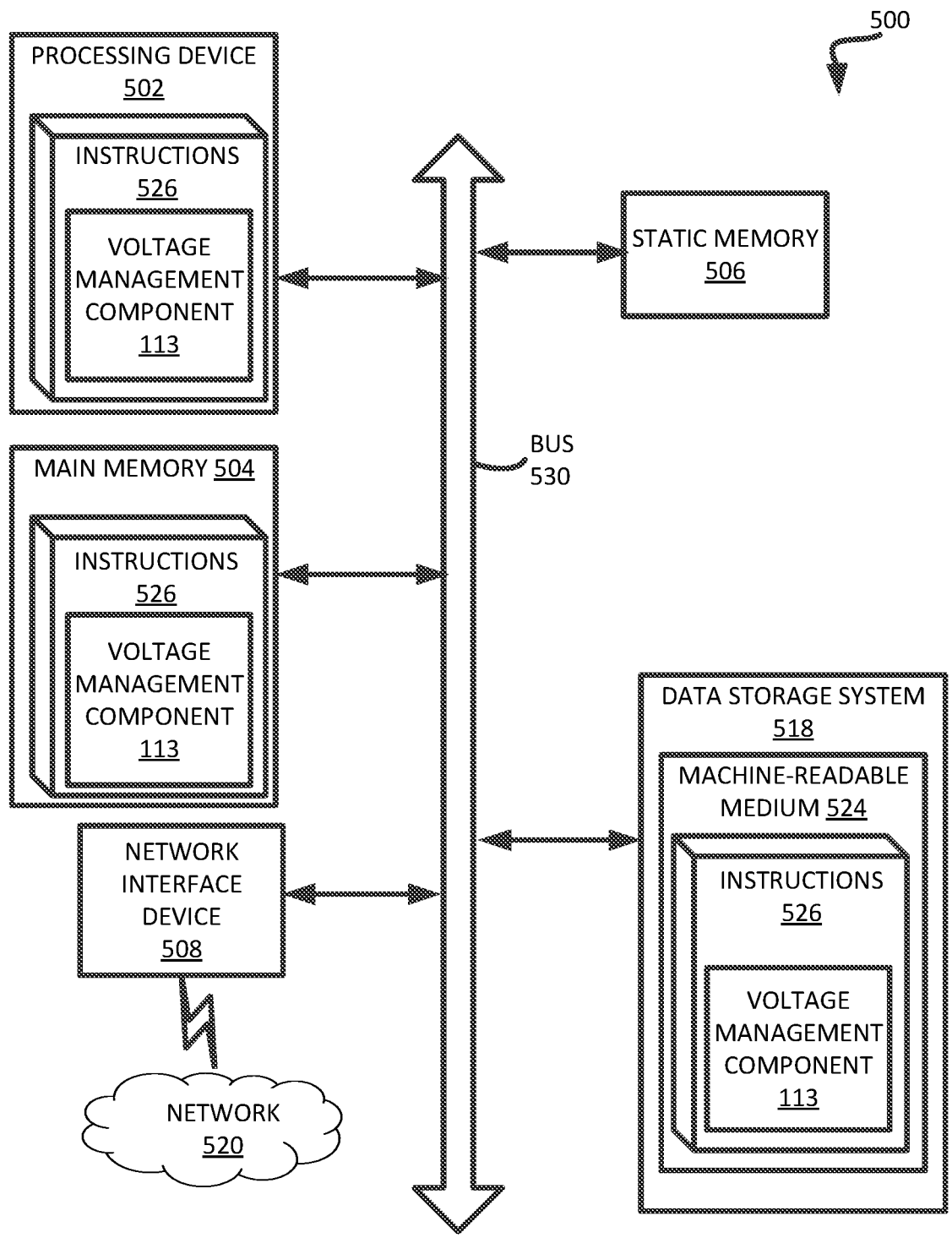
FIG. 5 is a block diagram of an example computer system in which implementations of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a voltage management component (e.g., the voltage management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   maintaining a plurality of read voltages to be used to retrieve data at a memory sub-system, wherein a value of a respective bit error rate associated with a respective read voltage of the plurality of read voltages changes in view of a write-to-read delay associated with the data;
   receiving a request to perform a read operation to retrieve a portion of the data at the memory sub-system;
   determining an amount of time that has elapsed since a time that a write operation was performed to store the portion of the data at the memory sub-system until a time to perform the read operation, the amount of time corresponding to the write-to-read delay associated with the portion of the data;
   selecting, based on the amount of time that has elapsed, the respective read voltage from the plurality of read voltages, wherein the value of the bit error rate associated with the respective read voltage satisfies a bit error rate criterion; and
   performing, by a processing device, the read operation to retrieve the portion of the data by using the selected read voltage.

2. The method of claim 1, wherein the plurality of read voltages comprises a sequence of read voltages and the read voltage selected to perform the read operation comprises an initial read voltage of the sequence of read voltages.

3. The method of claim 2, further comprising:
   determining that the read operation to retrieve the portion of the data by using the initial read voltage has failed;
   determining that a performance of an error control operation has not remedied the failed read operation; and
   performing the read operation to retrieve the portion of the data by using a subsequent read voltage from the sequence of read voltages.

4. The method of claim 1, wherein the time to perform the read operation comprises a time that the request to perform read operation was received.

5. The method of claim 1, wherein the time the write operation was performed to store the portion of the data comprises a time that a data group, comprising the portion of the data, was stored at the memory sub-system.

6. The method of claim 1, wherein the amount of time that has elapsed since the time the write operation was performed until the time to perform the read operation corresponds to a first time period, of a plurality of time periods, associated with the selected read voltage.

7. The method of claim 6, wherein the first time period overlaps with a second time period of the plurality of time periods and wherein determining the selected read voltage from the plurality of read voltages comprises:
   determining a first read voltage associated with the first time period;
   determining a second read voltage associated with the second time period; and
   selecting the first read voltage associated with the first time period or the second read voltage associated with the second time period based on at least one of a cross temperature associated with the memory sub-system, a wear level of the memory sub-system, or a cycle count associated with the memory sub-system.

8. A non-transitory computer readable medium comprising instructions, when executed by a processing device, cause the processing device to perform operations comprising:
   maintaining a plurality of read voltages to be used to retrieve data at a memory sub-system, wherein a value of a respective bit error rate associated with a respective read voltage of the plurality of read voltages changes in view of a write-to-read delay associated with the data;
   receiving a request to perform a read operation to retrieve a portion of the data at the memory sub-system;
   determining first indication of a time to perform the read operation;
   determining second indication of a time a write operation was performed to store the portion of the data at the memory sub-system;
   determining, based on the first indication and the second indication, an initial read voltage in a sequence of read voltages, wherein the value of the bit error rate associated with the initial read voltage satisfies a bit error rate criterion; and
   performing the read operation based on the sequence of read voltages, using the initial read voltage, to retrieve the portion of the data.

9. The non-transitory computer readable medium of claim 8, the operations further comprising:
   determining that the read operation to retrieve the portion of the data using the initial read voltage, has failed;
   determining that a performance of an error control operation has not remedied the failed read operation; and
   performing the read operation to retrieve the portion of the data using a subsequent read voltage from the sequence of read voltages.

10. The non-transitory computer readable medium of claim 8, wherein the first indication of the time to perform the read operation comprises a time that the request to perform read operation was received.

11. The non-transitory computer readable medium of claim 8, wherein the second indication of the time the write operation was performed to store the portion of the data comprises a time that a data group, comprising the portion of the data, was stored at the memory sub-system.

12. The non-transitory computer readable medium of claim 11, wherein the time the data group was stored at the memory sub-system comprises a time that a most recent write operation was performed for any data of the data group stored at the memory sub-system.

13. The non-transitory computer readable medium of claim 8, wherein the time of the first indication and the time of the second indication correspond to a first time period, of a plurality of time periods, associated with the initial read voltage, and wherein the first time period overlaps with a second time period of the plurality of time periods, and wherein selecting the initial read voltage in the sequence of read voltages comprises:
  determining a first read voltage associated with the first time period;
  determining a second read voltage associated with the second time period, wherein the second read voltage is subsequent to the first read voltage; and
  selecting the first read voltage or the second read voltage as the initial read voltage based on at least one of a cross temperature associated with the memory sub-system, a wear level of the memory sub-system, or a cycle count associated with the memory sub-system.

14. A system comprising:
  a memory component; and
  a processing device, operatively coupled with the memory component to:
    receive a request to perform a read operation to retrieve data at the memory component;
    determine a time to perform the read operation and a time a write operation was performed to store the data at the memory component;
    determine an amount of time that has elapsed since the time the write operation was performed until the time to perform the read operation, wherein the amount of time that has elapsed corresponds to a first time period of a plurality of time periods that overlaps with a second time period of the plurality of time periods;
    select, from a plurality of read voltages, a read voltage associated with the first time period or a read voltage associated with the second time period, wherein the read voltage is selected based on at least one of a cross temperature associated with the memory component, a wear level of the memory component, or a cycle count associated with the memory component;
    and perform the read operation to retrieve the data by using the selected read voltage.

15. The system of claim 14, wherein the plurality of read voltages comprises a sequence of read voltages and the selected read voltage comprises an initial read voltage of the sequence of read voltages.

16. The system of claim 15, wherein the processing device is further to:
  determine that the read operation to retrieve the data by using the initial read voltage has failed;
  determine that a performance of an error control operation has not remedied the failed read operation; and
  perform the read operation to retrieve the data by using a subsequent read voltage from the sequence of read voltages.

17. The system of claim 14, wherein the time to perform the read operation comprises a time that the request to perform read operation was received.

18. The system of claim 14, wherein the memory component comprises a first memory component, and wherein the time the write operation was performed to store the data comprises a time, identified from a second memory component associated with the first memory component, that a data group, comprising the data, was stored at the memory component.

19. The system of claim 14, wherein the selected read voltage corresponds to a performance metric that satisfies a performance metric criterion.

20. The system of claim 19, wherein the performance metric comprises a bit error rate and the performance metric criterion comprises a bit error rate criterion.

* * * * *